(12) United States Patent
Akamatsu et al.

(10) Patent No.: US 7,867,840 B2
(45) Date of Patent: Jan. 11, 2011

(54) SEMICONDUCTOR DEVICE AND METHOD OF FABRICATING THE SAME

(75) Inventors: Susumu Akamatsu, Osaka (JP); Masafumi Tsutsui, Shiga (JP); Yoshinori Takami, Kyoto (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/796,412

(22) Filed: Jun. 8, 2010

(65) Prior Publication Data
US 2010/0248438 A1 Sep. 30, 2010

Related U.S. Application Data

(62) Division of application No. 11/806,882, filed on Jun. 5, 2007, now Pat. No. 7,772,655.

(30) Foreign Application Priority Data

Aug. 9, 2006 (JP) .............................. 2006-216689

(51) Int. Cl.
*H01L 21/8238* (2006.01)
*H01L 31/113* (2006.01)
(52) U.S. Cl. .................................. 438/217; 257/391
(58) Field of Classification Search ................. 438/163, 438/217, 276, 289; 257/285, 391, E29.049, 257/E29.237
See application file for complete search history.

(56) References Cited

U.S. PATENT DOCUMENTS

| 5,773,863 A | 6/1998 | Burr et al. |
| 6,753,231 B2 | 6/2004 | Ikeda et al. |
| 7,190,050 B2 | 3/2007 | King et al. |
| 7,521,765 B2 * | 4/2009 | Tsutsumi et al. ............. 257/392 |
| 7,772,655 B2 * | 8/2010 | Akamatsu et al. ............ 257/391 |

FOREIGN PATENT DOCUMENTS

| JP | 05-335564 | 12/1993 |
| JP | 2002-368212 | 12/2002 |

* cited by examiner

*Primary Examiner*—Calvin Lee
(74) *Attorney, Agent, or Firm*—McDermott Will & Emery LLP

(57) ABSTRACT

In a semiconductor substrate in a first section, a channel region having an impurity concentration peak in an interior of the semiconductor substrate is formed, and in the semiconductor substrate in a second section and a third section, channel regions having an impurity concentration peak at a position close to a surface of the substrate are formed. Then, extension regions are formed in the first section, the second section and the third section. After that, the substrate is thermally treated to eliminate defects produced in the extension regions. Then, using gate electrodes and side-wall spacers as a mask, source/drain regions are formed in the first section, the second section and the third section.

10 Claims, 10 Drawing Sheets

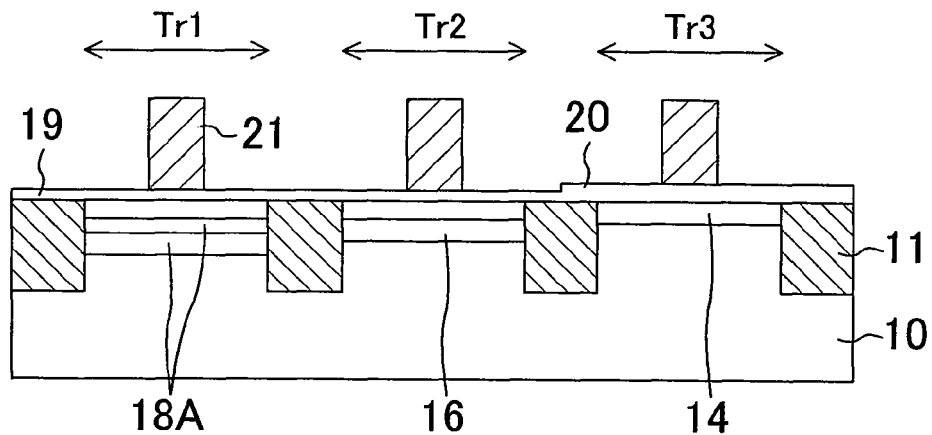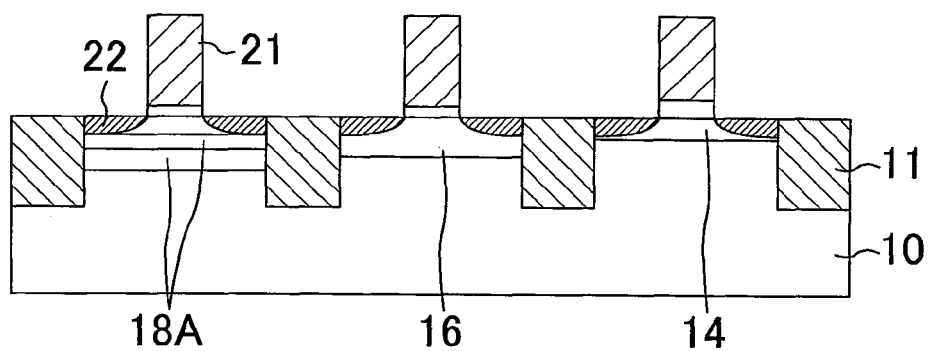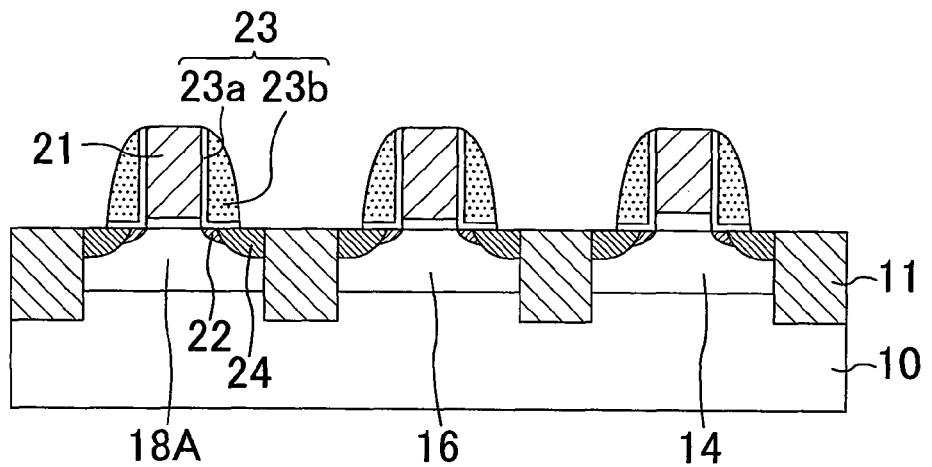

SEMICONDUCTOR DEVICE AND METHOD OF FABRICATING THE SAME

RELATED APPLICATIONS

This application is a Divisional of U.S. application Ser. No. 11/806,882, filed on Jun. 5, 2007 now U.S. Pat. No. 7,772,655, claiming priority of Japanese Patent Application No. 2006-216689, filed on Aug. 9, 2006, the entire contents of each of which are hereby incorporated by reference.

BACKGROUND OF THE INVENTION

1. Field of the Invention

The present invention relates to a semiconductor device including MIS transistors having different channel profiles and a method of fabricating the same.

2. Description of the Prior Art

In association with increase in integration, functionality, and speed of a semiconductor integrated circuit device in recent years, the cell area of an SRAM which is to be integrated has been reduced, and the size of a MIS transistor constituting the SRAM has been greatly reduced. However, there is a problem that reducing in size of the MIS transistor increases a random variation of characteristics caused by channel impurities and realizes no operating margin as the SRAM, which leads to an inoperative condition.

For reducing random components of the variation, a so-called retrograde channel structure is effective (see Japanese Laid-Open Patent Publication No. 5-335564). The retrograde channel structure has such an impurity profile of a channel region that the impurity concentration is low at an interface between a gate oxide film and a semiconductor substrate and an impurity concentration peak is located in the interior of the substrate.

A conventional method of fabricating a MIS transistor having a retrograde channel structure will be described with reference to cross sections illustrating steps in FIG. 10A through FIG. 10C.

As described with reference to FIG. 10A, on a p-type semiconductor substrate 101, device isolation regions 102 are formed. Then, a gate oxide film 103 and a gate electrode film 104 are formed.

Subsequently, as explained with reference to FIG. 10B, ions of boron (B) are implanted into the semiconductor substrate 101 through the gate oxide film 103 and the gate electrode film 104 to form a channel region 105 which has the impurity concentration peak in the interior of the substrate 101.

Finally, as explained with reference to FIG. 10C, the gate electrode film 104 is patterned to form a gate electrode 104. Then, using the gate electrode 104 as a mask, ions of arsenic (As) are implanted into the semiconductor substrate 101 to form the source 106 and the drain 107, so that the MIS transistor having the retrograde channel structure is formed.

In this method, the channel region 105 is formed by ion implantation after the gate oxide film 103 is formed. Therefore, it is possible to prevent that the implanted B impurity is thermally diffused by a high temperature treatment performed to form the gate oxide film 103. However, since ion implantation is performed through the gate oxide film 103 and the gate electrode 104, acceleration energy has to be increased, resulting in a broad profile after the implantation. Therefore, this method is not suitable for forming a miniaturized transistor.

Compared to this, Patent Document (Japanese Laid-Open Patent Publication No. 2002-368212) discloses a retrograde channel region formation method including the steps of: implanting ions of indium (In) having a greater mass and B having a higher activation rate into the semiconductor substrate at the same depth; and performing a short-time thermal treatment for about 10 seconds at a temperature of 950° C.

According to this method, the short-time thermal treatment performed after ions are implanted redistributes B as steeply as a distribution of In. This makes it possible to form a channel region which has a depth profile of In but in which B electrically serves as an impurity. Therefore, it is possible to form a retrograde channel region having a steep distribution.

SUMMARY OF THE INVENTION

It is true that the retrograde channel region having the steep distribution can be formed according to the method disclosed in the Patent Document mentioned above. However, for example, in a case where a semiconductor integrated circuit device including a SRAM, a logic circuit, an I/O circuit, and the like is formed on a semiconductor substrate, problems as follows arise.

That is, since characteristics required for MIS transistors constituting the SRAM, the logic circuit, the I/O circuit, and the like are different from each other, MIS transistors which differ from each other in configuration itself are adopted. For example, for the SRAM for which miniaturization is required, a MIS transistor having the retrograde channel structure is adopted, and for the logic circuit and the I/O circuit, MIS transistors having an ordinary surface channel structure are adopted.

Now, to form a miniaturized MIS transistor, it is necessary to form extension regions, a channel stopper region, source/drain regions, and the like as well as to form a channel region. In order to form the above-mentioned regions, ions of impurities are implanted into the semiconductor substrate. Then, after the last ion implantation (usually, ion implantation of source/drain impurities) is performed, these impurities introduced by ion implantation are together subjected to a thermal treatment for activation.

However, the extension regions are formed close to a semiconductor substrate surface side in the retrograde channel region. If an insulation film such as an oxide film for forming side-wall spacers is formed at a temperature of 400° C. to 600° C. on the extension regions in which defects produced in implanting ions to form the extension region still remain, an impurity forming the retrograde channel region diffuses toward the semiconductor substrate surface side (hereinafter referred to as "surface diffusion"). This increases the concentration at a surface of the substrate in the retrograde channel region, impairing primary effect of the retrograde channel. Nevertheless, in the conventional thermal treatment performed for activation, influence of the defects produced in the extension regions on the impurity distribution in the retrograde channel region has almost never been taken into consideration.

In view of the above-mentioned problems, a main object of the present invention is to provide a highly reliable semiconductor device including MIS transistors at least one of which has a retrograde channel structure, wherein a variation of transistor characteristics by random components is suppressed, and a method of manufacturing the same.

To achieve the above-mentioned object, the present invention adopts the method including the step of eliminating defects produced in extension regions due to ion implantation. This step is performed after a retrograde channel region and extension regions of a MIS transistor are formed and before side-wall spacers are formed on side surfaces of a gate electrode. Adding this step makes it possible to prevent the surface diffusion of the impurity in the retrograde channel region, even if the thermal treatment is performed after the formation of the source/drain regions to activate the impurities in the retrograde channel region, the extension regions, and the source/drain regions. Therefore, even if a MIS transistor having the retrograde channel structure and a MIS transistor having a channel structure which has an impurity concentration peak at the substrate surface (hereinafter, referred to as "an ordinary surface cannel structure") are simultaneously formed, it is possible to realize a highly reliable semiconductor device in which characteristics specific to the retrograde channel are not impaired and a variation of transistor characteristics by random components is suppressed.

A semiconductor device of the present invention includes a first MIS transistor and a second MIS transistor on a semiconductor substrate, the first MIS transistor including: a first gate insulation film on the semiconductor substrate in a first MIS transistor formation section, a first gate electrode on the first gate insulation film, a first channel region in the first MIS transistor formation section, the first channel region having an impurity concentration peak in an interior apart from a surface of the semiconductor substrate in the first MIS transistor formation section, and a first extension region below side of the first gate electrode in the first MIS transistor formation section, and the second MIS transistor including: a second gate insulation film on the semiconductor substrate in a second MIS transistor formation section, a second gate electrode on the second gate insulation film, a second channel region in the second MIS transistor formation section, the second channel region having an impurity concentration peak at a position close to a surface of the semiconductor substrate in the second MIS transistor formation section, and a second extension region below side of the second gate electrode in the second MIS transistor formation section.

In a preferable embodiment, the first MIS transistor further includes: a first side-wall spacer on a side surface of the first gate electrode; and a first source/drain region below side of the first side-wall spacer in the first MIS transistor formation section, and the second MIS transistor further includes: a second side-wall spacer on a side surface of the second gate electrode; and a second source/drain region below side of the second side-wall spacer in the second MIS transistor formation section.

It is preferable that the second gate insulation film has the same film thickness as that of the first gate insulation film.

It is preferable that the second gate insulation film has a film thickness greater than that of the first gate insulation film.

It is preferable that the first channel region contains a first impurity and a second impurity which have the same conduction type, species of the first impurity and the second impurity being different from each other.

In a preferable embodiment, the semiconductor device further includes a third MIS transistor on the semiconductor substrate, the third MIS transistor including: a third gate insulation film on the semiconductor substrate in a third MIS transistor formation section, the third gate insulation film having a film thickness greater than those of the first gate insulation film and the second gate insulation film; a third gate electrode on the third gate insulation film; and a third channel region in the third MIS transistor formation section, the third channel region having an impurity concentration peak at a position close to a surface of the semiconductor substrate in the third MIS transistor formation section.

In a preferable embodiment, the semiconductor device further includes a third MIS transistor on the semiconductor substrate, the third MIS transistor including: a third gate insulation film on the semiconductor substrate in a third MIS transistor formation section, the third gate insulation film having the same film thickness as that of the first gate insulation film; a third gate electrode on the third gate insulation film; and a third channel region in the third MIS transistor formation section, the third channel region having an impurity concentration peak in an interior apart from a surface of the semiconductor substrate in the third MIS transistor formation section and containing the second impurity.

It is preferable that the first MIS transistor is a transistor constituting an SRAM.

A method of fabricating a semiconductor device of the present invention including a first MIS transistor and a second MIS transistor whose impurity concentration profiles in channel regions being different from each other, the method comprising the steps of: (a) implanting ions of a first impurity into a semiconductor substrate in a first MIS transistor formation section to form a first channel region which has an impurity concentration peak in an interior apart from a surface of the semiconductor substrate in the first MIS transistor formation section; (b) implanting ions of a second impurity into the semiconductor substrate in a second MIS transistor formation section to form a second channel region which has the impurity concentration peak at a position close to a surface of the semiconductor substrate in the second MIS transistor formation section; (c) forming a first gate electrode over the semiconductor substrate in the first MIS transistor formation section through a first gate insulation film, and forming a second gate electrode over the semiconductor substrate in the second MIS transistor formation section through a second gate insulation film; (d) implanting ions of a third impurity using the first gate electrode and the second gate electrode as a mask to form a first extension region and a second extension region in the first MIS transistor formation section and in the second MIS transistor formation section; and (e) after step (d), thermally treating the semiconductor substrate to eliminate defects produced in the first extension region and the second extension region due to implanting the ions of the third impurity.

In a preferable embodiment, the method further includes the steps of: (f) after step (e), forming a first side-wall spacer on a side surface of the first gate electrode and a second side-wall spacer on a side surface of the second gate electrode; and (g) implanting ions of a fourth impurity into the semiconductor substrate in the first MIS transistor formation section using the first gate electrode and the first side-wall spacer as a mask to form a first source/drain region and into the semiconductor substrate in the second MIS transistor formation section using the second gate electrode and the second side-wall spacer as a mask to form a second source/drain region.

In a preferable embodiment, the method further includes the step of: (h) after step (g), thermally treating the semiconductor substrate to activate the first impurity, the second impurity, the third impurity and the fourth impurity which are introduced by ion implantation into the substrate in the first MIS transistor formation section and in the second MIS transistor formation section.

In a preferable embodiment, step (d) includes forming the first extension regions to have a depth substantially corresponding to a position of the impurity concentration peak of the first impurity in the first channel region.

It is preferable that the second gate insulation film has the same film thickness as that of the first gate insulation film.

It is preferable that the second gate insulation film has a film thickness greater than that of the first gate insulation film.

In a preferable embodiment, the method further includes the step of: (i) before step (c), implanting ions of a fifth impurity into the semiconductor substrate in the first MIS transistor formation section to form the first channel region containing the first impurity and the fifth impurity such that the impurity concentration peak is located in an interior apart from a surface of the semiconductor substrate in the first MIS transistor formation section, the fifth impurity having the same conduction type as that of the first impurity, and species of the first impurity and the fifth impurity being different from each other.

In a preferable embodiment, the semiconductor device further includes a third MIS transistor having a third channel region, the method further including the step of: (j) before step (c), implanting ions of a sixth impurity into the semiconductor substrate in a third MIS transistor formation section to form the third channel region, the third channel region having the impurity concentration peak at a position close to a surface of the semiconductor substrate in the third MIS transistor formation section, wherein step (c) includes forming a third gate electrode over the semiconductor substrate in the third MIS transistor formation section through a third gate insulation film having the same film thickness as that of the first gate insulation film.

In a preferable embodiment, the semiconductor device further includes a third MIS transistor having a third channel region, step (i) includes implanting ions of the fifth impurity into the semiconductor substrate in a third MIS transistor formation section to form the third channel, the third channel region having the impurity concentration peak in an interior apart from a surface of the semiconductor substrate in the third MIS transistor formation section, and step (c) includes forming a third gate electrode over the semiconductor substrate in the third MIS transistor formation section through a third gate insulation film having the same film thickness as that of the first gate insulation film.

In a preferable embodiment, the semiconductor device further includes a third MIS transistor having a third channel region, the method further including the steps of: (k) after steps (a) and (b) and before step (c), forming the second gate insulation film on the semiconductor substrate in the first to third transistor formation sections, wherein step (i) includes, after step (k) and before step (c), implanting ions of the fifth impurity through the second gate insulation film into the semiconductor substrate in the first MIS transistor formation section and in the third MIS transistor formation section to form the first channel region in the first MIS transistor formation section and the third channel region in the third MIS transistor formation section, the third channel region having the impurity concentration peak in an interior apart from a surface of the semiconductor substrate in the third MIS transistor formation section; and (l) after step (i) and before step (c), removing the second gate insulation film on the semiconductor substrate in the first MIS transistor formation section and in the third MIS transistor formation section, and then forming the first gate insulation film in the first MIS transistor formation section and forming third gate insulation film in the third MIS transistor formation section, the third gate insulation film having the same film thickness as that of the first gate insulation film, wherein step (c) includes forming a third gate electrode over the semiconductor substrate in the third MIS transistor formation section through the third gate insulation film.

According to a semiconductor device of the present invention and a method of fabricating the same, it is possible to realize a highly reliable semiconductor integrated device in which characteristics specific to the retrograde channel are not impaired and a variation of transistor characteristics by random components is suppressed even when a MIS transistor having a retrograde channel structure and a MIS transistor having an ordinary surface channel structure are simultaneously formed.

BRIEF DESCRIPTION OF THE DRAWINGS

FIG. 5A through FIG. 5C are cross sections with which steps of the method of fabricating the semiconductor device of Embodiment 2 of the present invention are described.

FIG. 6 shows a structure of the semiconductor device of Embodiment 2 of the present invention, wherein

DESCRIPTION OF THE PREFERRED EMBODIMENTS

Figure 1A:
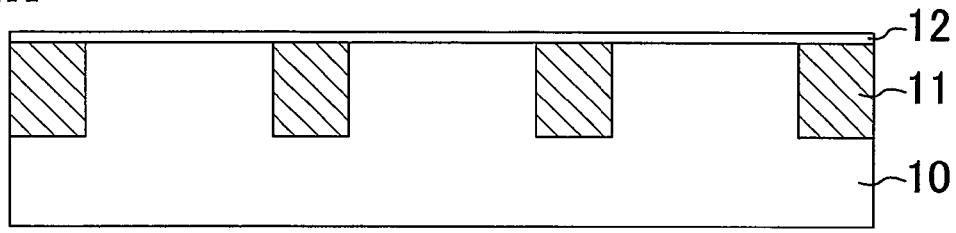
FIG. 1A through FIG. 1D are cross sections with which steps of a method of fabricating a semiconductor device of Embodiment 1 of the present invention are described.

Embodiments of the present invention will be described below with reference to the drawings. In each of the following drawings, like components having substantially the same function as those of any preceding components will be denoted by like reference numerals for simplifying the description.

The present invention is directed to a semiconductor device including two or more types of MIS transistors at least one of which has a retrograde channel structure. The present invention is not specifically limited as to transistor structures (such as a gate insulation film, a gate electrode, and the source/drain) excepting a channel region. In Embodiments below, descriptions are given with reference to an exemplary semiconductor device having three types of MIS transistors. However, the present invention has the technical meaning in a relationship between a MIS transistor having a retrograde channel structure and a MIS transistor having an ordinary surface channel structure.

Embodiment 1

FIG. 1A through FIG. 2C are schematic cross sections with which steps of a method of fabricating a semiconductor device of Embodiment 1 of the present invention are described.

First, referring to FIG. 1A, in a semiconductor substrate 10 formed of silicon, device isolation regions 11 are formed to divide the semiconductor substrate 10 into a section in which a first MIS transistor is to be formed (hereinafter referred to as "section Tr1"), a section in which a second MIS transistor is to be formed (hereinafter referred to as "section Tr2"), and a section in which a third MIS transistor is to be formed (hereinafter referred to as "section Tr3"). In Embodiment 1, an n-type MIS transistor constituting an SRAM is formed in the section Tr1, an n-type MIS transistor (low voltage drive transistor) constituting a logic circuit is formed in the section Tr2, and an n-type MIS transistor constituting an I/O circuit is formed in the section Tr3. In this case, the n-type MIS transistor constituting the I/O circuit is a MIS transistor (high voltage drive transistor) which has a drive voltage (for example, 3.3 V) which is higher than a drive voltage (for example, 1.2 V) of the n-type MIS transistor constituting the SRAM or the logic circuit.

Then, on a surface of the semiconductor substrate 10, a protection film 12 is formed. The protection film 12 is formed by an oxide film having a thickness of 10 nm or less. Then, in each of the sections Tr1 to Tr3, a p-type well (not shown) is formed.

Figure 1B:
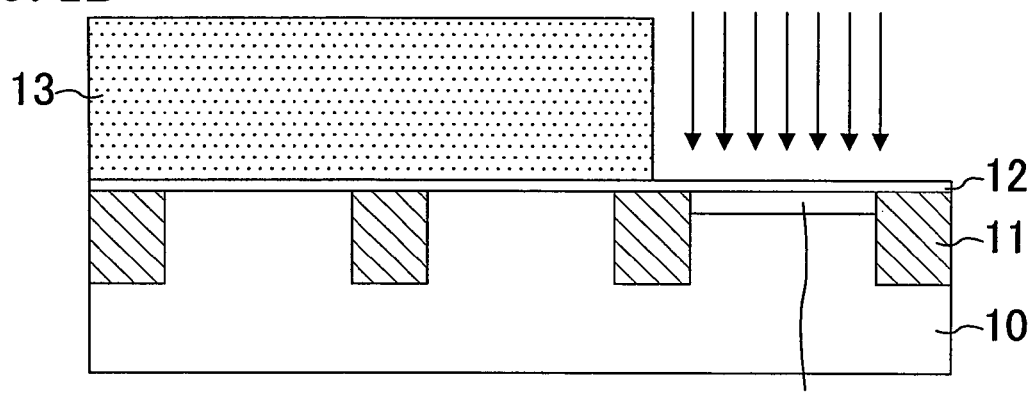

Next, referring to FIG. 1B, over the semiconductor substrate 10, a resist mask 13 is formed, the resist mask 13 covering the semiconductor substrate 10 in the section Tr1 and the section Tr2 and having an opening in the section Tr3. Then, using the resist mask 13 as an implantation mask, ions of boron (B) which is a p-type impurity are implanted through the protection film 12 into the semiconductor substrate 10 in the section Tr3 with an acceleration energy of about 10 keV to form a channel region 14. The channel region 14 has an impurity concentration peak at a position close to the surface of the semiconductor substrate 10, and the dose at the impurity concentration peak is set to such a value that the n-type MIS transistor which is to be formed in the section Tr3 and which is driven at a high voltage obtains a predetermined threshold value (for example, 0.4 V).

Figure 1C:
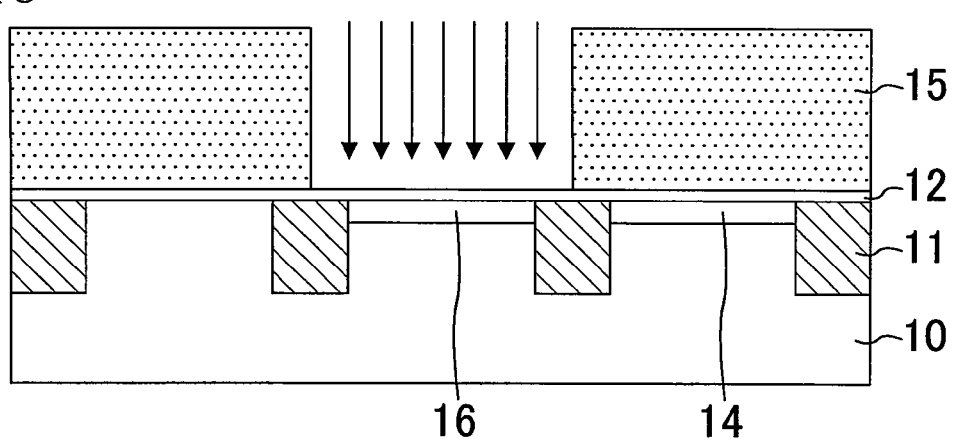

Next, referring to FIG. 1C, the resist mask 13 is removed. Then, over the semiconductor substrate 10, a resist mask 15 is formed, the resist mask 15 covering the semiconductor substrate 10 in the section Tr1 and the section Tr3 and having an opening in the section Tr2. Then, using the resist mask 15 as an implantation mask, ions of B are implanted through the protection film 12 into the semiconductor substrate 10 in the section Tr2 with an acceleration energy of about 10 keV to form a channel region 16. The channel region 16 has an impurity concentration peak at a position close to the surface of the semiconductor substrate 10, and the dose at the impurity concentration peak is set to such a value that the MIS transistor which is to be formed in the section Tr2 and which constitutes the logic circuit obtains a predetermined threshold value (for example, 0.3 V).

Figure 1D:
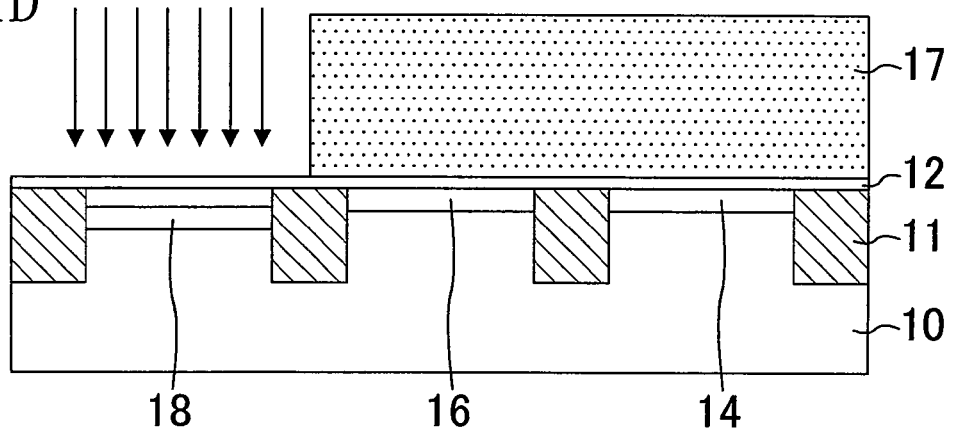

Next, referring to FIG. 1D, the resist mask 15 is removed. Then, over the semiconductor substrate 10, a resist mask 17 is formed, the resist mask 17 covering the semiconductor substrate 10 in the section Tr2 and the section Tr3 and having an opening in the section Tr1. Then, using the resist mask 17 as an implantation mask, ions of B are implanted through the protection film 12 into the semiconductor substrate 10 in the section Tr1 with an acceleration energy of about 15 keV to form a channel region 18. The channel region 18 has a retrograde channel structure which has a peak concentration of equal to or greater than $1 \times 10^{18}/cm^3$ in the interior of the semiconductor substrate 10.

Figure 2A:
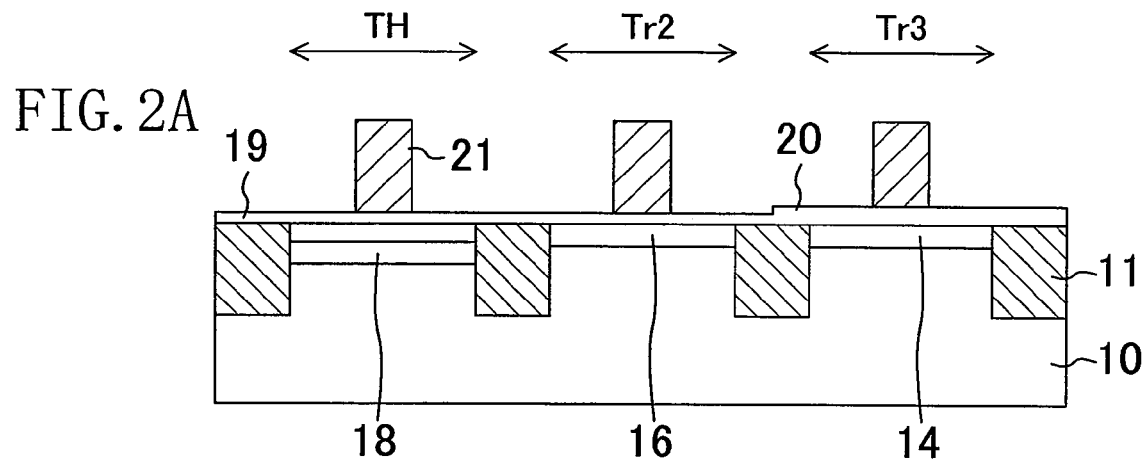
FIG. 2A through FIG. 2C are cross sections with which steps of the method of fabricating the semiconductor device of Embodiment 1 of the present invention are described.

Next, referring to FIG. 2A, the resist mask 17 and the protection film 12 are removed. Then, over the semiconductor substrate 10 in each of the sections Tr1 and Tr2, a gate insulation film 19 is formed. The gate insulation film 19 is formed by a silicon oxynitride film having a thickness of about 2 nm, the silicon oxynitride film being formed by plasma nitridation of a silicon oxide film. Over the semiconductor substrate 10 in the section Tr3, a gate insulation film 20 is formed, the gate insulation film 20 having a thickness of about 7.5 nm and being formed by plasma nitridation of a surface of the silicon oxide film. Then, on the gate insulation films 19 and 20, a polysilicon film having a thickness of about 100 nm is formed. Then, the polysilicon film is anisotropically etched to form gate electrodes 21.

Figure 2B:
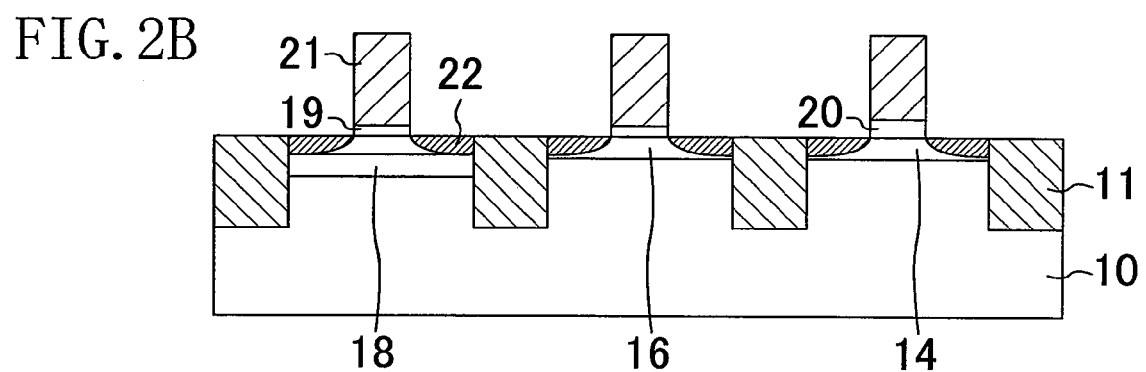

Next, referring to FIG. 2B, ions of arsenic (As) which is an n-type impurity are selectively implanted into the semiconductor substrate 10 in the sections Tr1 to Tr3 using the gate electrodes 21 as a mask to form n-type extension regions 22 in a self-alignment manner.

Then, the semiconductor substrate 10 is subjected to a short-time thermal treatment, for example, for about 10 seconds at a temperature of 950° C. This eliminates defects produced in the extension regions 22 in implanting the ions of As. Note that, the short-time thermal treatment does not cause the thermal diffusion of impurities in the channel regions 14, 16, and 18 formed in the sections Tr1 to Tr3.

Figure 2C:
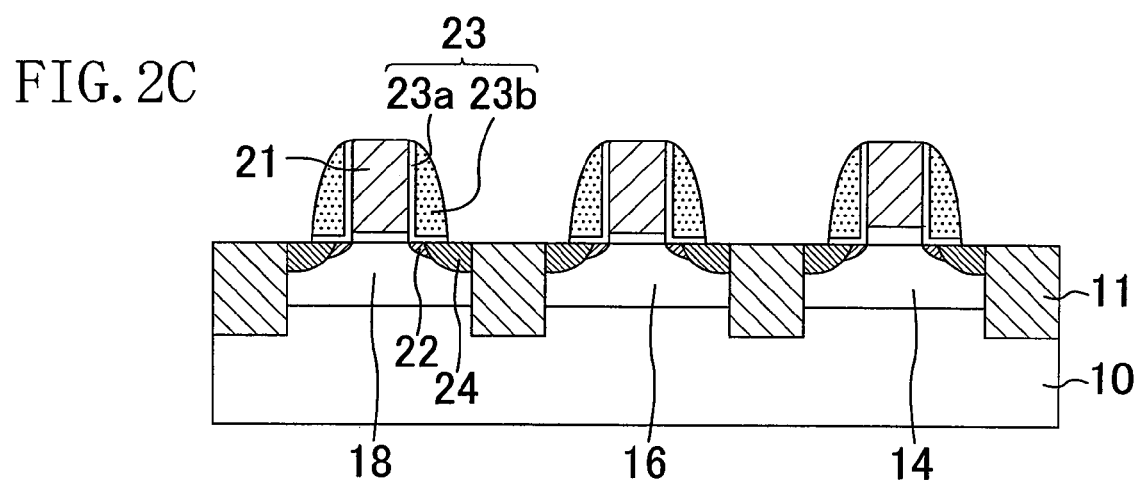

Then, referring to FIG. 2C, on side surfaces of each of the gate electrodes 21, side-wall spacers 23 are formed. Each of the side-wall spacers 23 is composed of an L-shaped silicon oxide film 23a and a silicon nitride film 23b formed on the silicon oxide film 23a. Then, using the gate electrodes 21 and the side-wall spacers 23 as a mask, ions of As which is an n-type impurity are selectively implanted to form n-type source/drain regions 24 in a self alignment manner.

Figure 3A:
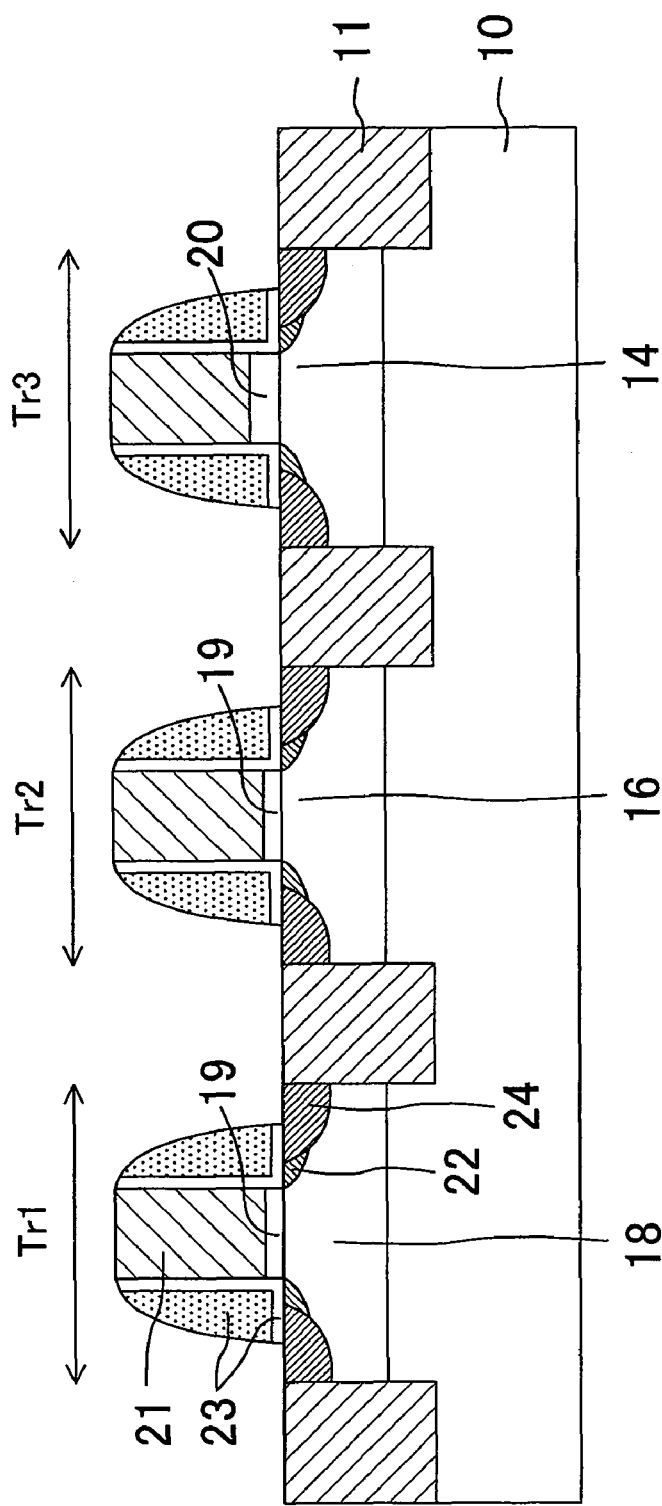
FIG. 3A is a cross section illustrating a structure of the semiconductor device of Embodiment 1 of the present invention.
Figure 3B:
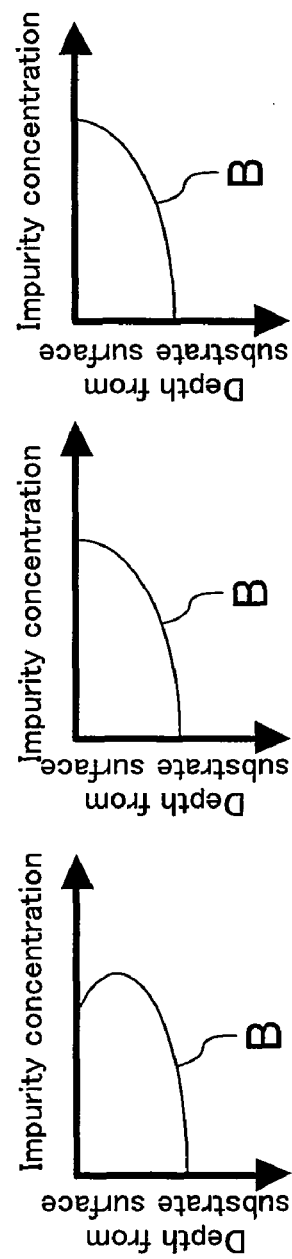
FIG. 3B shows impurity profiles in channel regions.

FIG. 3 are views illustrating the n-type MIS transistors formed in the sections Tr1 to Tr3 according to the fabrication method mentioned above, wherein FIG. 3A is a cross section illustrating a structure of the n-type MIS transistors, and FIG. 3B shows profiles of the impurity concentration of the channel regions 14, 16, and 18.

The n-type MIS transistor formed in the section Tr1 has a retrograde channel structure as shown in FIG. 3B and is applied to a transistor constituting an SRAM which has a strict specification with regard to miniaturization and variation of transistor characteristics. Compared to this, each of the n-type MIS transistors formed in the sections Tr2 and Tr3 has an ordinary surface channel structure. In this case, the n-type MIS transistor having the thin gate insulation film 19 formed in the section Tr2 has a low threshold value and is applied to a low voltage drive transistor constituting a logic circuit which requires high-speed operation. The n-type MIS transistor having the thick gate insulation film 20 formed in the section Tr3 is applied to a high voltage drive transistor.

The method of fabricating the semiconductor device of Embodiment 1 includes the step of performing the short-time thermal treatment on the semiconductor substrate 10 to eliminate the defects produced in the extension regions 22 by ion implantation, the step being performed after the channel regions 14, 16, and 18, and the extension regions 22 are formed in the sections Tr1 to Tr3 and before the side-wall spacers 23 are formed. According to this method, it is possible to prevent the surface diffusion of impurity in the retrograde channel region 18 formed in the section Tr1 even in such a case that the side-wall spacers 23 are formed on the side surfaces of the gate electrodes 21, the source/drain regions 24 are further formed, and then a thermal treatment is performed to activate impurities in the extension regions 22 and the source/drain regions 24. As a result, it is possible to realize a highly reliable semiconductor integrated device in which characteristics specific to the retrograde channel are not impaired and a variation of transistor characteristics by random components is suppressed even when a MIS transistor having a retrograde channel structure and a MIS transistor having an ordinary surface channel structure are simultaneously formed.

Moreover, if the extension regions 22 are formed to have a depth corresponding to the position of the impurity concentration peak in the retrograde channel region 18, it is possible to suppress the expansion of a depletion layer from the source/drain regions 24. This further realizes the effect of suppressing reduction in threshold voltage along with a shortening gate length, which is a so-called short channel effect.

According to the fabrication method, described above, it is possible to obtain a semiconductor device including a first n-type MIS transistor, a second n-type MIS transistor, and a third n-type MIS transistor. The first n-type MIS transistor includes: a gate insulation film 19 formed over a semiconductor substrate 10; a gate electrode 21 formed on the gate insulation film 19; and a channel region 18 which has an impurity concentration peak in an interior of the semiconductor substrate 10 (at a position apart from a surface of the semiconductor substrate). The second n-type MIS transistor includes: a gate insulation film 19 formed over the semiconductor substrate 10; a gate electrode 21 formed on the gate insulation film 19; and a channel region 16 which has the impurity concentration peak close to the surface of the semiconductor substrate 10. The third n-type MIS transistor includes: a gate insulation film 20 formed over the semiconductor substrate 10, the gate insulation film 20 having a film thickness greater than that of the gate insulation film 19; a gate electrode 21 formed on the gate insulation film 20; and a channel region 14 which has the impurity concentration peak close to the surface of the semiconductor substrate 10.

Embodiment 2

Figure 4A:
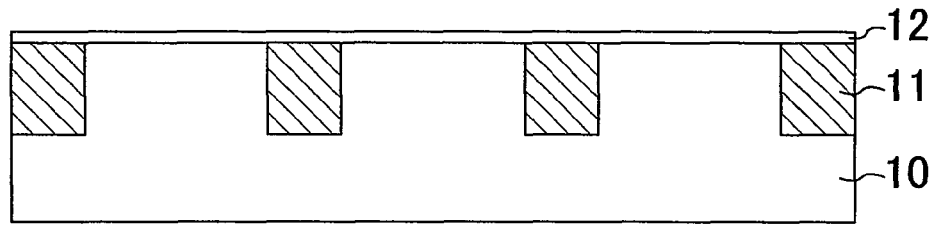
FIG. 4A through FIG. 4D are cross sections with which steps of a method of fabricating a semiconductor device of Embodiment 2 of the present invention are described.
Figure 4B:
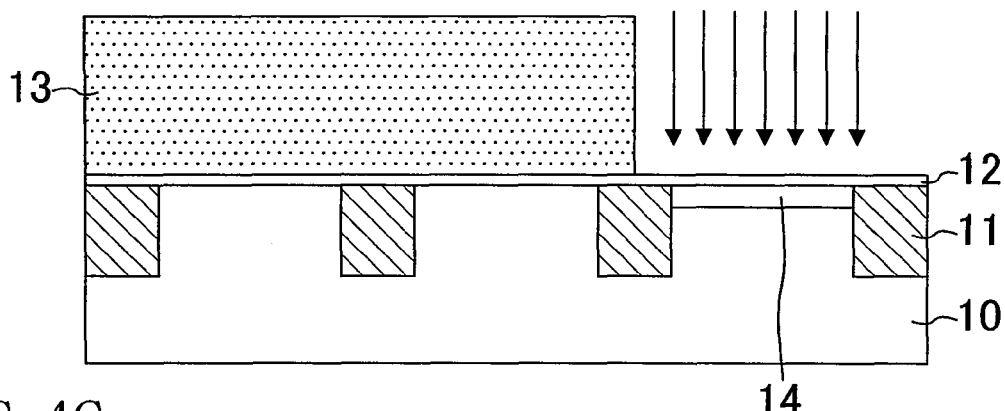
Figure 4C:
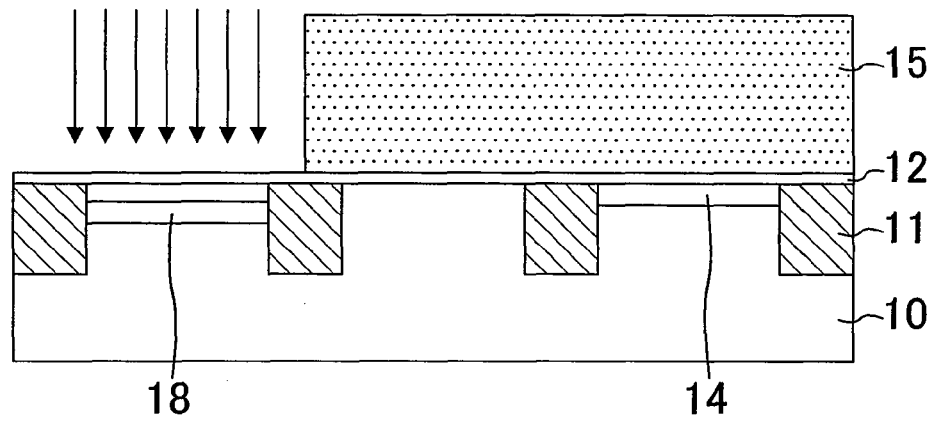

FIG. 4A through FIG. 4C are schematic cross sections with which steps of a method of fabricating a semiconductor device of Embodiment 2 of the present invention are described.

First, referring to FIG. 4A, in a semiconductor substrate 10 formed of silicon, device isolation regions 11 are formed to section the semiconductor substrate 10 into a section in which a first MIS transistor is to be formed (hereinafter referred to as "section Tr1"), a section in which a second MIS transistor is to be formed (hereinafter referred to as "section Tr2"), and a section in which a third MIS transistor is to be formed (hereinafter referred to as "section Tr3"). In Embodiment 2, an n-type MIS transistor constituting an SRAM is formed in the section Tr1, an n-type MIS transistor which constitutes a logic circuit and which is driven at a low voltage is formed in the section Tr2, and an n-type MIS transistor which is driven at a high voltage is formed in the section Tr3 as is the case with Embodiment 1.

Then, on a surface of the semiconductor substrate 10, a protection film 12 is formed. The protection film 12 is formed by an oxide film having a thickness of 10 nm or less. Then, in each of the sections Tr1 to Tr3, a p-type well (not shown) is formed.

Next, referring to FIG. 4B, over the semiconductor substrate 10, a resist mask 13 is formed, the resist mask 13 covering the semiconductor substrate 10 in the section Tr1 and the section Tr2 and having an opening in the section Tr3. Then, using the resist mask 13 as an implantation mask, ions of B are implanted through the protection film 12 into the semiconductor substrate 10 in the section Tr3 with an acceleration energy of about 10 keV to form a channel region 14. The channel region 14 has an impurity concentration peak at a position close to the surface of the semiconductor substrate 10, and the dose at the impurity concentration peak is set to such a value that the n-type MIS transistor which is to be formed in the section Tr3 and which is driven at a high voltage obtains a predetermined threshold (for example, 0.4 V).

Next, referring to FIG. 4C, the resist mask 13 is removed. Then, over the semiconductor substrate 10, a resist mask 15 is formed, the resist mask 15 covering the semiconductor substrate 10 in the section Tr2 and the section Tr3 and having an opening in the section Tr1. Then, using the resist mask 15 as an implantation mask, ions of indium (In) are implanted through the protection film 12 into the semiconductor substrate 10 in the section Tr1 with an acceleration energy of about 50 keV to form a channel region 18. The channel region 18 has a retrograde channel structure which has a peak concentration of equal to or greater than $1 \times 10^{18}/cm^3$ in the interior of the semiconductor substrate 10 (at a position apart from the surface of the semiconductor substrate).

Figure 4D:
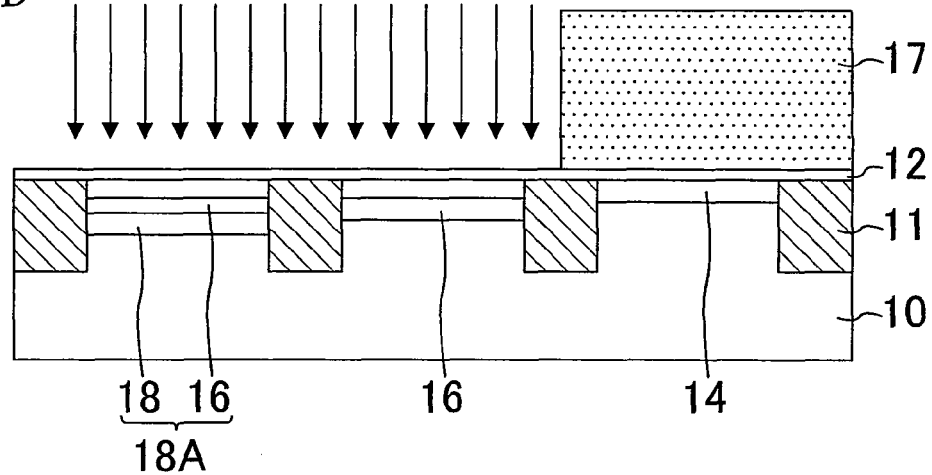

Next, referring to FIG. 4D, the resist mask 15 is removed. Then, over the semiconductor substrate 10, a resist mask 17 is formed, the resist mask 17 covering the semiconductor substrate 10 in the section Tr3 and having an opening in the sections Tr1 and TR2. Then, using the resist mask 17 as an implantation mask, ions of B are implanted through the protection film 12 into the semiconductor substrate 10 in the sections Tr1 and Tr2 with an acceleration energy of about 15 keV. In this case, a channel region 16 is formed in the section Tr2. The channel region 16 has a retrograde channel structure which has a peak concentration of equal to or greater than $1 \times 10^{18}/cm^3$ in the interior of the semiconductor substrate 10 (at a position apart from the surface of the semiconductor substrate). Moreover, in the section Tr1, a channel region 18A is formed. The channel region 18A has such an impurity profile that an impurity profile of the channel region 16 formed of B overlaps with an impurity profile of the channel region 18 formed of In.

Next, referring to FIG. 5A, the resist mask 17 and the protection film 12 are removed. Then, over the semiconductor substrate 10 in the sections Tr1 and Tr2, a gate insulation film 19 is formed. The gate insulation film 19 is formed by a silicon oxynitride film having a thickness of about 2 nm, the silicon oxynitride film being formed by plasma nitridation of a silicon oxide film. Over the semiconductor substrate 10 in the section Tr3, a gate insulation film 20 is formed, the gate insulation film 20 having a thickness of about 7.5 nm and being formed by plasma nitridation of a surface of the silicon oxide film. Then, on the gate insulation films 19 and 20, a polysilicon film having a thickness of about 100 nm is formed. Then, the polysilicon film is anisotropically etched to form gate electrodes 21.

Next, referring to FIG. 5B, ions of As which is an n-type impurity are selectively implanted into the semiconductor substrate 10 in the sections Tr1 to Tr3 using the gate electrodes 21 as a mask to form n-type extension regions 22 in a self-alignment manner.

Then, the semiconductor substrate 10 is subjected to a short-time thermal treatment, for example, for about 10 seconds at a temperature of 950° C. This eliminates defects produced in the extension regions 22 in implanting the ions of As. Note that, the short-time thermal treatment does not cause the thermal diffusion of impurities in the channel regions 14, 16, and 18A formed in the sections Tr1 to Tr3.

Then, referring to FIG. 5C, on side surfaces of each of the gate electrodes 21, side-wall spacers 23 are formed. Each of the side-wall spacers 23 is composed of an L-shaped silicon oxide film 23a and a silicon nitride film 23b formed on the silicon oxide film 23a. Then, using the gate electrodes 21 and the side-wall spacers 23 as a mask, ions of As which is an n-type impurity are selectively implanted to form n-type source/drain regions 24 in a self alignment manner.

Figure 6A:
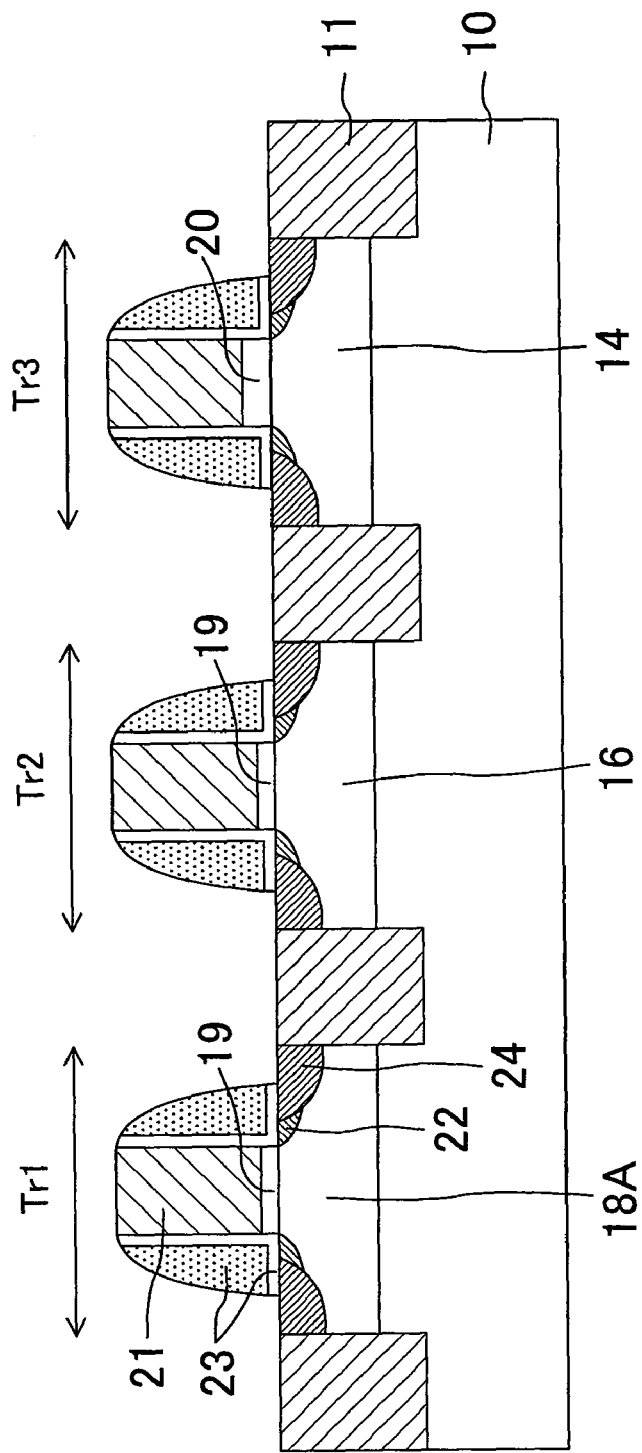
FIG. 6A is a cross section illustrating the semiconductor device of Embodiment 2 and FIG. 6B shows impurity profiles in channel regions.
Figure 6B:
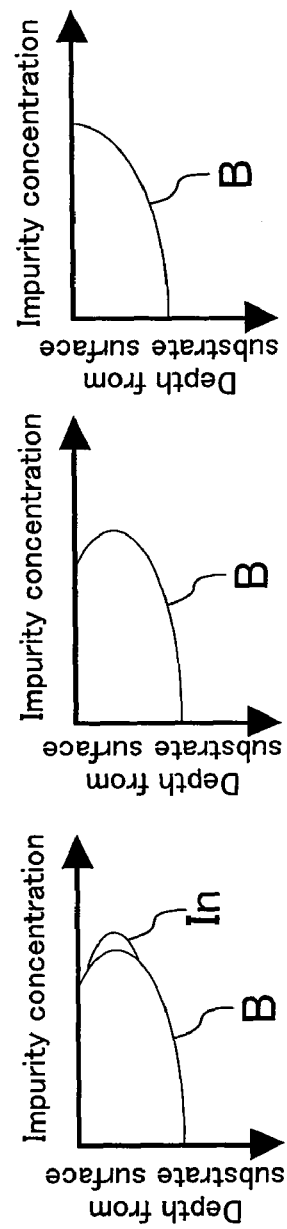

FIG. 6 are views illustrating the n-type MIS transistors formed in the sections Tr1 to Tr3 according to the fabrication method mentioned above, wherein FIG. 6A is a cross section illustrating a structure of the n-type MIS transistors, and FIG. 6B shows profiles of the impurity concentration of the channel regions 14, 16, and 18A.

Each of the n-type MIS transistors formed in the sections Tr1 and Tr2 has a retrograde channel structure and the thin gate insulation film 19. However, since In and B impurities are implanted in the channel region 18A in the section Tr1, the channel region 18A has a retrograde channel structure which has a steeper distribution as shown in FIG. 6B. Therefore, it is preferable that the n-type MIS transistor formed in the section Tr1 is applied to a transistor constituting an SRAM which has a strict specification with regard to miniaturization and variation of transistor characteristics. Meanwhile, it is preferable that the n-type MIS transistor formed in the section Tr2 is applied to a transistor constituting a logic circuit which requires miniaturization and high-speed operation. Moreover, it is preferable that the n-type MIS transistor which has an ordinary surface channel structure and which has the thick gate insulation film 20 is applied to a high voltage drive transistor.

Embodiment 3

FIG. 7A through FIG. 8C are schematic cross sections with which steps of a method of fabricating a semiconductor device of Embodiment 3 of the present invention are described.

Figure 7A:
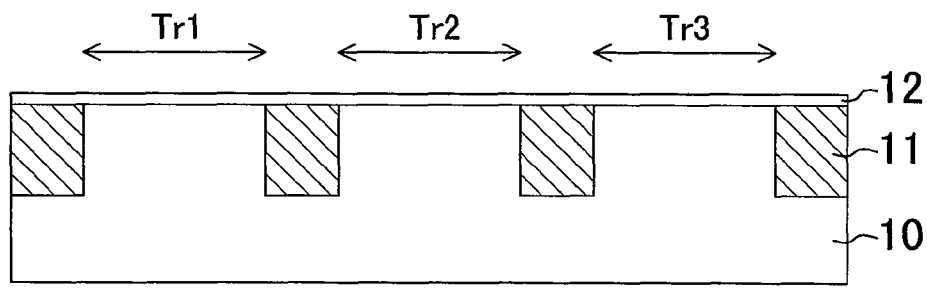
FIG. 7A through FIG. 7D are cross sections with which steps of a method of fabricating a semiconductor device of Embodiment 3 of the present invention are described.

First, referring to FIG. 7A, in a semiconductor substrate 10 formed of silicon, device isolation regions 11 are formed to section the semiconductor substrate 10 into a section in which a first MIS transistor is to be formed (hereinafter referred to as "section Tr1"), a section in which a second MIS transistor is to be formed (hereinafter referred to as "section Tr2"), and a section in which a third MIS transistor is to be formed (hereinafter referred to as "section Tr3"). In Embodiment 3, an n-type MIS transistor constituting an SRAM is formed in the section Tr1, an n-type MIS transistor which constitutes a logic circuit and which is driven at a low voltage is formed in the section Tr2, and an n-type MIS transistor which is driven at a high voltage is formed in the section Tr3 as in the case with Embodiment 1.

Then, on a surface of the semiconductor substrate 10, a protection film 12 is formed. The protection film 12 is formed by an oxide film having a thickness of 10 nm or less. Then, in each of the sections Tr1 to Tr3, a p-type well (not shown) is formed.

Figure 7B:
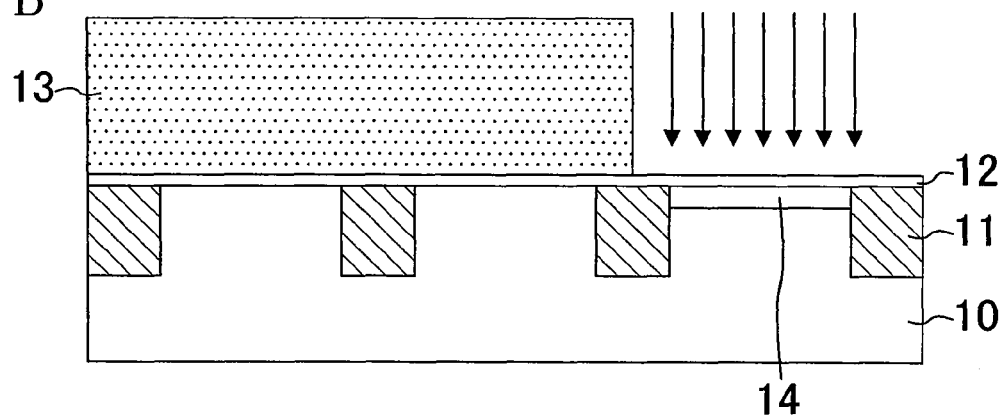

Next, referring to FIG. 7B, over the semiconductor substrate 10, a resist mask 13 is formed, the resist mask 13 covering the semiconductor substrate 10 in the section Tr1 and the section Tr2 and having an opening in the section Tr3. Then, using the resist mask 13 as an implantation mask, ions of B are implanted through the protection film 12 into the semiconductor substrate 10 in the section Tr3 with an acceleration energy of about 10 keV to form a channel region 14. The channel region 14 has an impurity concentration peak at a position close to the surface of the semiconductor substrate 10, and the dose at the impurity concentration peak is set to such a value that the n-type MIS transistor which is to be formed in the section Tr3 and which is driven at a high voltage obtains a predetermined threshold (for example, 0.4 V).

Figure 7C:
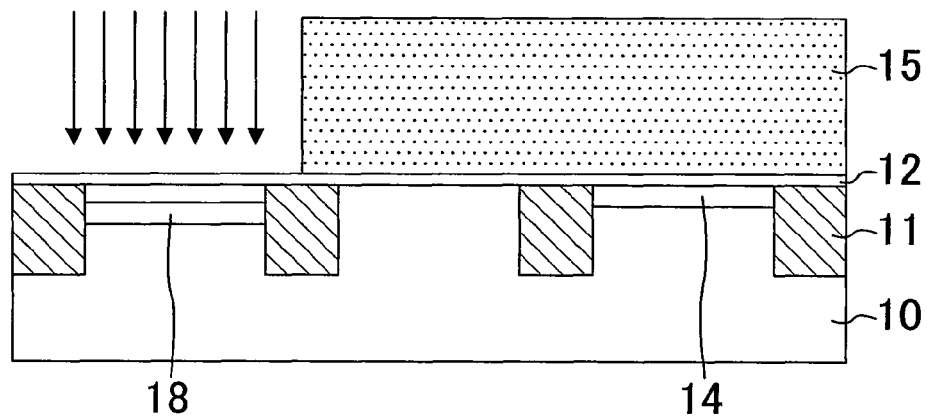

Next, referring to FIG. 7C, the resist mask 13 is removed. Then, over the semiconductor substrate 10, a resist mask 15 is formed, the resist mask 15 covering the semiconductor substrate 10 in section Tr2 and the section Tr3 and having an opening in the section Tr1. Then, using the resist mask 15 as an implantation mask, ions of In are implanted through the protection film 12 into the semiconductor substrate 10 in the section Tr1 with an acceleration energy of about 50 keV to form a channel region 18.

Figure 7D:
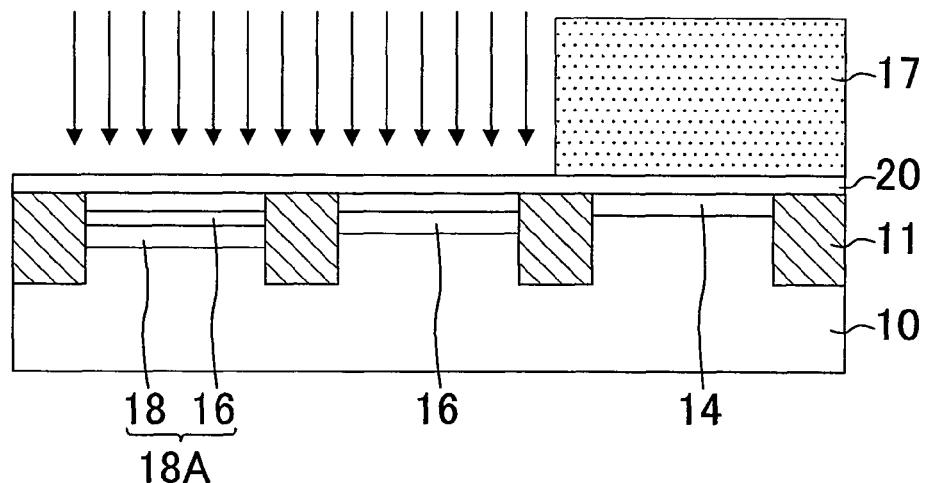

Next, referring to FIG. 7D, the resist mask 15 and the protection film 12 are removed. Then, over the semiconductor substrate 10, a gate insulation film 20 is formed, the gate insulation film 20 being formed by a silicon oxide film having a thickness of 7.5 nm. Then, over the semiconductor substrate 10, a resist mask 17 is formed, the resist mask 17 covering the semiconductor substrate 10 in the section Tr3 and having an opening in the sections Tr1 and Tr2. Then, using the resist mask 17 as an implantation mask, ions of B are implanted through the gate insulation film 20 into the semiconductor substrate 10 in the sections Tr1 and Tr2 with an acceleration energy of about 15 keV. In this case, in the section Tr2, a channel region 16 is formed. The channel region 16 has a retrograde channel structure which has a peak concentration of equal to or greater than $1 \times 10^{18}/cm^3$ in the interior of the semiconductor substrate 10 (at a position apart from the surface of the semiconductor substrate). Moreover, in the section Tr1, a channel region 18A is formed. The channel region 18A has such an impurity profile that an impurity profile of the channel region 16 formed of B overlaps with an impurity profile of the channel region 18 formed of In. The channel region 18A has a retrograde channel structure which has a peak concentration of equal to or greater than $1 \times 10^{18}/cm^3$ in the interior of the semiconductor substrate 10 (at a position apart from the surface of the semiconductor substrate).

Figure 8A:
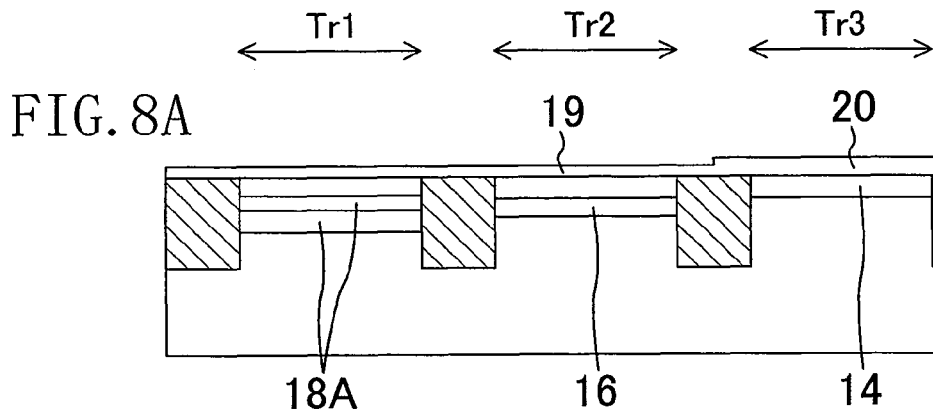
FIG. 8A through FIG. 8D are cross sections with which steps of the method of fabricating the semiconductor device of Embodiment 3 of the present invention are described.

Next, referring to FIG. 8A, the gate insulation film 20 formed over the semiconductor substrate 10 in the sections Tr1 and Tr2 is removed by using the resist mask 17, and then the resist mask 17 is removed. Then, a silicon oxide film is formed again over the semiconductor substrate 10 in the sections Tr1 and Tr2, the silicon oxide film having a thickness of about 2 nm. Then, a gate insulation film 19 is formed by a silicon oxynitride film formed by plasma nitridation of the silicon oxide film. In this case, a surface of the gate insulation film 20 is also subjected to plasma nitridation, the gate insulation film 20 being formed by the silicon oxide film formed on the semiconductor substrate 10 in the section Tr3.

Figure 8B:
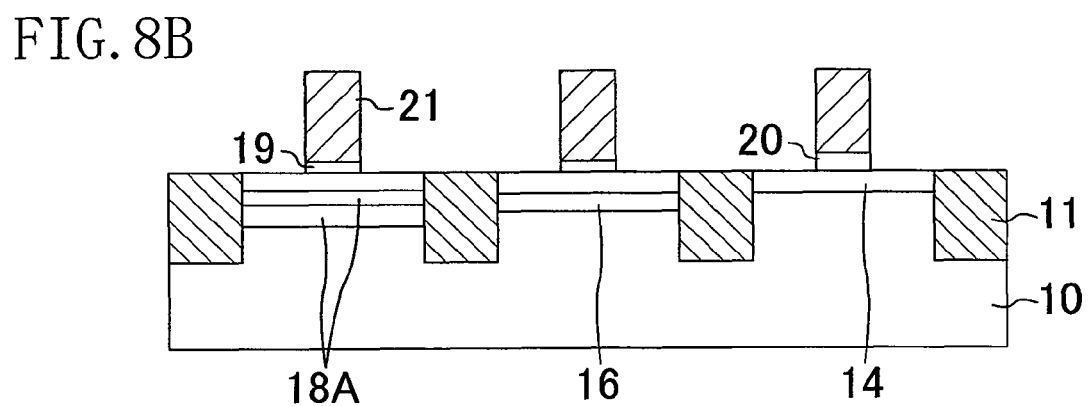

Then, referring to FIG. 8B, on the gate insulation films 19 and 20, a polysilicon film having a thickness of about 100 nm is formed. Then, the polysilicon film is anisotropically etched to form gate electrodes 21.

Figure 8C:
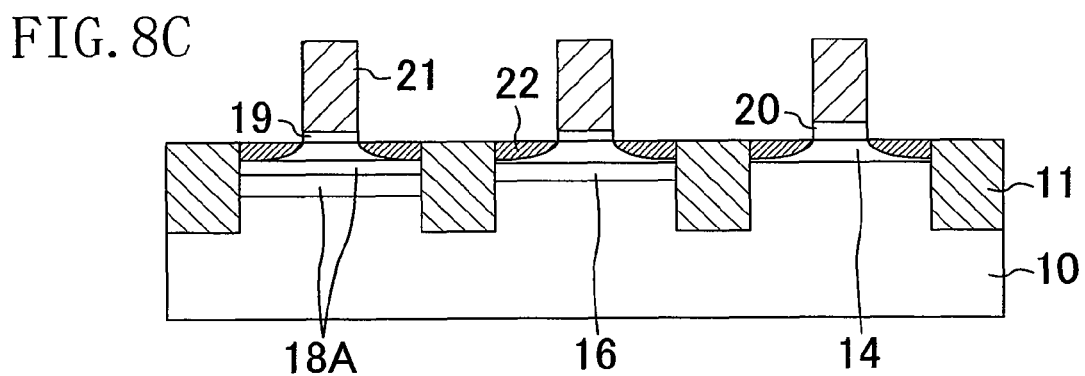

Next, referring to FIG. 8C, ions of arsenic which is an n-type impurity are selectively implanted into the semiconductor substrate 10 in the sections Tr1 to Tr3 using the gate electrodes 21 as a mask to form n-type extension regions 22 in a self-alignment manner.

Then, the semiconductor substrate 10 is subjected to a short-time thermal treatment, for example, for about 10 seconds at a temperature of 950° C. This eliminates defects produced in the extension regions 22 in implanting ions of As. Note that, the short-time thermal treatment does not cause the thermal diffusion of impurities in the channel regions 14, 16, and 18A formed in the sections Tr1 to Tr3.

Figure 8D:
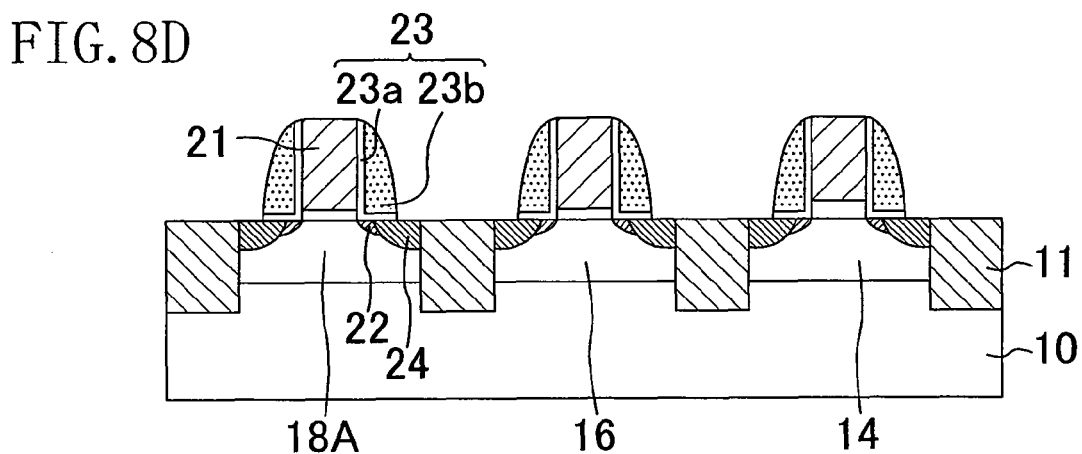

Then, referring to FIG. 8D, on side surfaces of each of the gate electrodes 21, side-wall spacers 23 are formed. Each of the side-wall spacers 23 is composed of an L-shaped silicon oxide film 23a and a silicon nitride film 23b formed on the silicon oxide film 23a. Then, using the gate electrodes 21 and the side-wall spacers 23 as a mask, ions of As which is an n-type impurity are selectively implanted to form n-type source/drain regions 24 in a self alignment manner.

According to the fabrication method described above, in the step described with reference to FIG. 7D, the thick gate insulation film 20 is formed, and then ions of impurity (B) forming the channel regions 16 and 18A are implanted into the semiconductor substrate 10 in the sections Tr1 and Tr2. A thermal treatment performed after this step is only the thermal treatment as described with reference to FIG. 8A to form the thin gate insulation film 19. Therefore, compared to Embodiment 2, it is possible to realize a steeper impurity concentration profile of the retrograde channel regions 16 and 18A formed in the sections Tr1 and Tr2.

Figure 9A:
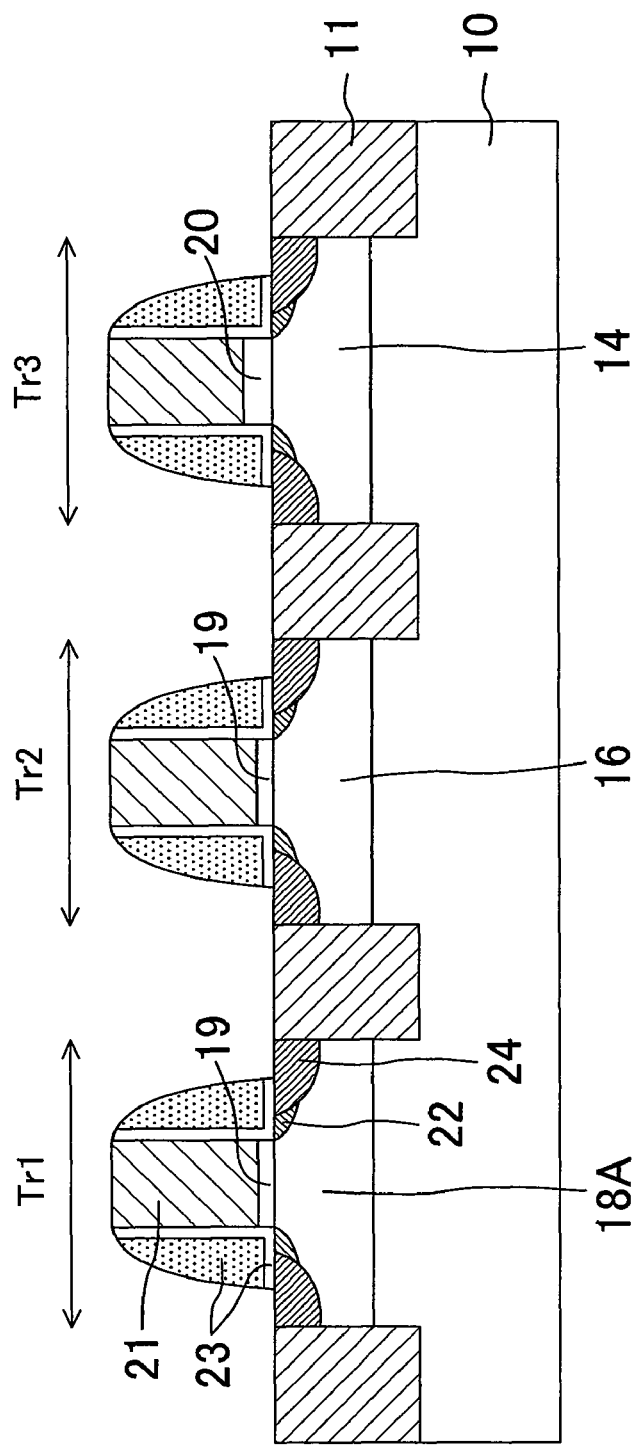
FIG. 9A is a cross section illustrating a structure of the semiconductor device of Embodiment 3 of the present invention.
Figure 9B:
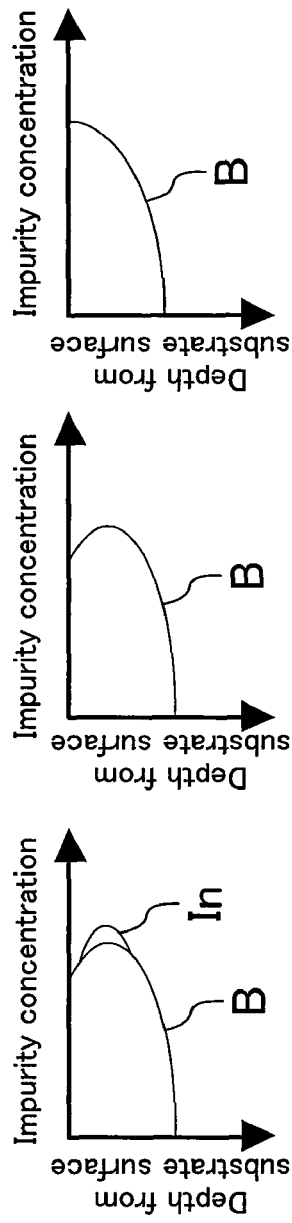
FIG. 9B shows impurity profiles in channel regions.
Figure 10A:
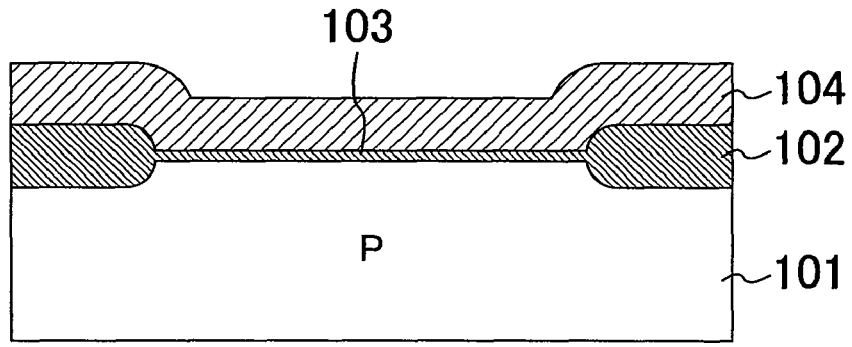
FIG. 10 is a cross section with which steps of a conventional method of fabricating a MIS transistor having a retrograde channel structure are described.
Figure 10B:
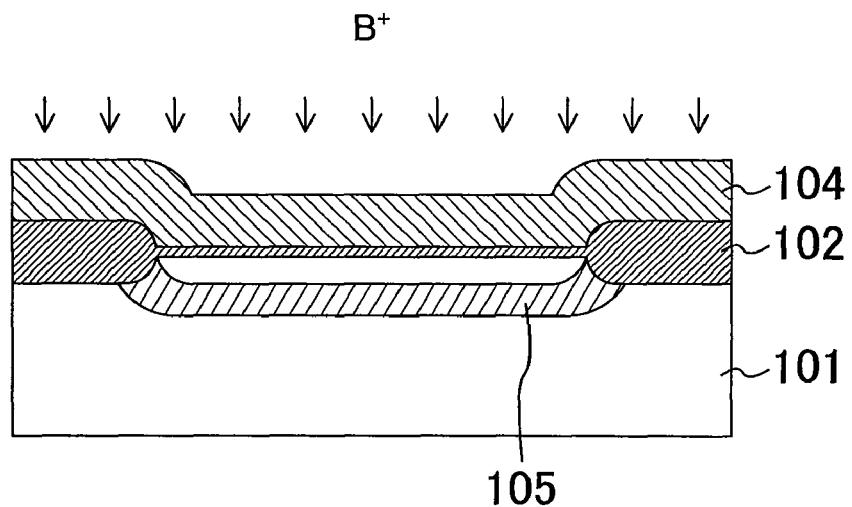
Figure 10C:
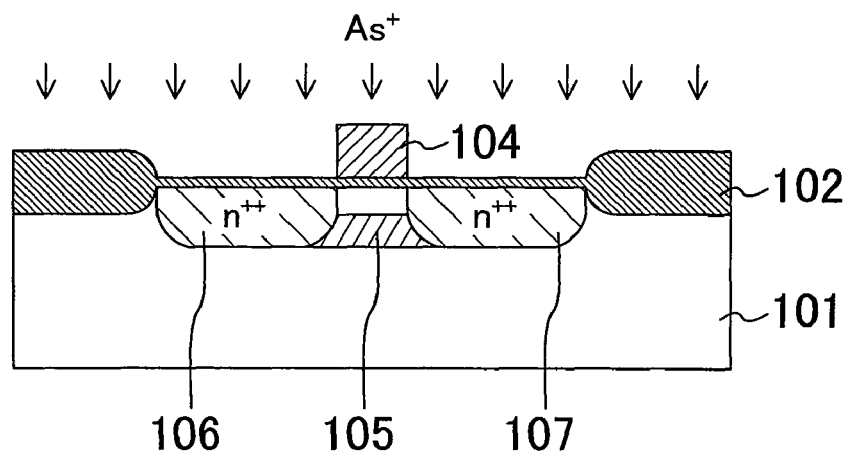

FIG. 9 are views illustrating the n-type MIS transistors formed in the sections Tr1 to Tr3 according to the fabrication method mentioned above, wherein FIG. 9A is a cross section illustrating a structure of the n-type MIS transistors, and FIG. 9B shows profiles of the impurity concentration of the channel regions 14, 16, and 18A.

Each of the n-type MIS transistors formed in the sections Tr1 and Tr2 has a retrograde channel structure and the thin gate insulation film 19. However, since In and B impurities are implanted in the channel region 18A in the section Tr1, the channel region 18 has a retrograde channel structure which has a steeper distribution as shown in FIG. 9B. Therefore, it is preferable that the n-type MIS transistor formed in the section Tr1 is applied to a transistor constituting an SRAM which has a strict specification with regard to miniaturization and variation of transistor characteristics. Meanwhile, it is preferable that the n-type MIS transistor formed in the section Tr2 is applied to a transistor constituting a logic circuit which requires miniaturization and high-speed operation. Moreover, it is preferable that the n-type MIS transistor which has an ordinary surface channel structure and which has the thick gate insulation film 20 is applied to a high voltage drive transistor.

The present invention has been described with reference to preferred embodiments. However, these descriptions are not to limit the scope of the invention, and of course, various modifications are possible. For example, p-type MIS transistors may be simultaneously formed in the sections Tr1 to Tr3 although the p-type MIS transistors are formed in Embodiments. In this case, it is possible to form a retrograde channel region by implanting ions of As instead of In and an ordinary channel region by implanting ions of P instead of B. Moreover, extension regions, and source/drain regions can be formed by implanting ions of B or $BF_2$.

In Embodiments, descriptions have been given with reference to a semiconductor device including a MIS transistor having a retrograde channel structure and a MIS transistor having an ordinary surface channel structure. However, applying the fabrication method described in Embodiments to a semiconductor device including only MIS transistors having retrograde channel structures makes it possible to realize a highly reliable semiconductor device in which a variation of transistor characteristics by random components is suppressed.

What is claimed is:

1. A method of fabricating a semiconductor device including a first MIS transistor of a first conductive type and a second MIS transistor of the first conductive type whose impurity concentration profiles in channel regions being different from each other, the method comprising the steps of:
    (a) implanting ions of a first impurity into a semiconductor substrate in a first MIS transistor formation section to form a first channel region of a second conductive type which has an impurity concentration peak in an interior apart from a surface of the semiconductor substrate in the first MIS transistor formation section;
    (b) implanting ions of a second impurity into the semiconductor substrate in a second MIS transistor formation section to form a second channel region of the second conductive type which has the impurity concentration peak at a position close to a surface of the semiconductor substrate in the second MIS transistor formation section;
    (c) forming a first gate electrode over the semiconductor substrate in the first MIS transistor formation section through a first gate insulation film, and forming a second gate electrode over the semiconductor substrate in the second MIS transistor formation section through a second gate insulation film;
    (d) implanting ions of a third impurity using the first gate electrode and the second gate electrode as a mask to form a first extension region of the first conductive type and a second extension region of the first conductive type in the first MIS transistor formation section and in the second MIS transistor formation section; and
    (e) after step (d), thermally treating the semiconductor substrate to eliminate defects produced in the first extension region and the second extension region due to implanting the ions of the third impurity.

2. The method of claim 1, further comprising the steps of:
    (f) after step (e), forming a first side-wall spacer on a side surface of the first gate electrode and a second side-wall spacer on a side surface of the second gate electrode; and
    (g) implanting ions of a fourth impurity into the semiconductor substrate in the first MIS transistor formation section using the first gate electrode and the first side-wall spacer as a mask to form a first source/drain region of the first conductive type and into the semiconductor substrate in the second MIS transistor formation section using the second gate electrode and the second side-wall spacer as a mask to form a second source/drain region of the first conductive type.

3. The method of claim 2, further comprising the step of:
    (h) after step (g), thermally treating the semiconductor substrate to activate the first impurity, the second impurity, the third impurity and the fourth impurity which are introduced by ion implantation into the substrate in the first MIS transistor formation section and in the second MIS transistor formation section.

4. The method of claim 1, wherein step (d) includes forming the first extension regions to have a depth substantially corresponding to a position of the impurity concentration peak of the first impurity in the first channel region.

5. The method of claim 1, wherein the second gate insulation film has the same film thickness as that of the first gate insulation film.

6. The method of claim 1, wherein the second gate insulation film has a film thickness greater than that of the first gate insulation film.

7. The method of claim 6, further comprising the step of:
(i) before step (c), implanting ions of a fifth impurity into the semiconductor substrate in the first MIS transistor formation section to form the first channel region containing the first impurity and the fifth impurity such that the impurity concentration peak is located in an interior apart from a surface of the semiconductor substrate in the first MIS transistor formation section, the fifth impurity having the same conduction type as that of the first impurity, and species of the first impurity and the fifth impurity being different from each other.

8. The method of claim 7, wherein
the semiconductor device further comprises a third MIS transistor of the first conductive type having a third channel region,
step (i) includes implanting ions of the fifth impurity into the semiconductor substrate in a third MIS transistor formation section to form the third channel region of the second conductive type, the third channel region having the impurity concentration peak in an interior apart from a surface of the semiconductor substrate in the third MIS transistor formation section, and
step (c) includes forming a third gate electrode over the semiconductor substrate in the third MIS transistor formation section through a third gate insulation film having the same film thickness as that of the first gate insulation film.

9. The method of claim 7, wherein the semiconductor device further comprises a third MIS transistor of the first conductive type having a third channel region, the method further including the steps of:
(k) after steps (a) and (b) and before step (c), forming the second gate insulation film on the semiconductor substrate in the first to third transistor formation sections,
wherein step (i) includes, after step (k) and before step (c), implanting ions of the fifth impurity through the second gate insulation film into the semiconductor substrate in the first MIS transistor formation section and in the third MIS transistor formation section to form the first channel region in the first MIS transistor formation section and the third channel region of the second conductive type in the third MIS transistor formation section, the third channel region having the impurity concentration peak in an interior apart from a surface of the semiconductor substrate in the third MIS transistor formation section; and
(l) after step (i) and before step (c), removing the second gate insulation film on the semiconductor substrate in the first MIS transistor formation section and in the third MIS transistor formation section, and then forming the first gate insulation film in the first MIS transistor formation section and forming third gate insulation film in the third MIS transistor formation section, the third gate insulation film having the same film thickness as that of the first gate insulation film,
wherein step (c) includes forming a third gate electrode over the semiconductor substrate in the third MIS transistor formation section through the third gate insulation film.

10. The method of claim 6, wherein the semiconductor device further comprises a third MIS transistor of the first conductive type having a third channel region, the method further including the step of:
(j) before step (c), implanting ions of a sixth impurity into the semiconductor substrate in a third MIS transistor formation section to form the third channel region of the second conductive type, the third channel region having the impurity concentration peak at a position close to a surface of the semiconductor substrate in the third MIS transistor formation section,
wherein step (c) includes forming a third gate electrode over the semiconductor substrate in the third MIS transistor formation section through a third gate insulation film having the same film thickness as that of the first gate insulation film.

* * * * *